United States Patent [19]
Arai

[11] Patent Number: 5,841,174
[45] Date of Patent: Nov. 24, 1998

[54] SEMICONDUCTOR APPARATUS INCLUDING SEMICONDUCTOR DEVICES OPERATED BY PLURAL POWER SUPPLIES

[75] Inventor: Norihisa Arai, Omiya, Japan

[73] Assignee: Kabushiki Kaisa Toshiba, Japan

[21] Appl. No.: 539,723

[22] Filed: Oct. 5, 1995

[30] Foreign Application Priority Data

Oct. 6, 1994 [JP] Japan .................................... 6-242648

[51] Int. Cl.$^6$ .................................................. H01L 29/76
[52] U.S. Cl. .......................... 257/392; 257/408; 257/316; 257/500
[58] Field of Search ..................................... 257/316, 368, 257/389, 392, 408, 411, 413, 500

[56] References Cited

U.S. PATENT DOCUMENTS

| | | | |
|---|---|---|---|
| 4,471,373 | 9/1984 | Shimizu et al. .......................... | 257/392 |
| 5,241,208 | 8/1993 | Taguchi .................................... | 257/500 |
| 5,355,010 | 10/1994 | Fujii et al. .............................. | 257/413 |
| 5,497,021 | 3/1996 | Tada ........................................ | 257/392 |

FOREIGN PATENT DOCUMENTS 1305573  12/1989  Japan ..................................... 257/389

*Primary Examiner*—Mark V. Prenty
*Attorney, Agent, or Firm*—Banner & Witcoff, Ltd.

[57] ABSTRACT

After a gate electrode of a high withstand voltage device is formed, a gate bird's beak is formed on the gate electrode by post-heat treatment. After a gate electrode of a low withstand voltage is formed, no post-heat treatment is performed and no gate bird's beak is formed. Ions are injected through a thermal oxidation film, thereby forming diffusion layers of the high withstand voltage device. Ions are directly injected in a semiconductor substrate, thereby forming diffusion layers of the low withstand voltage device. Accordingly, the impurity concentration in the diffusion layers of the low withstand voltage device is higher than that in the diffusion layers of the high withstand voltage device.

17 Claims, 6 Drawing Sheets

HVD ◄──┼── LVD (LVD)MCF ←—|—→ PDF (HVD)

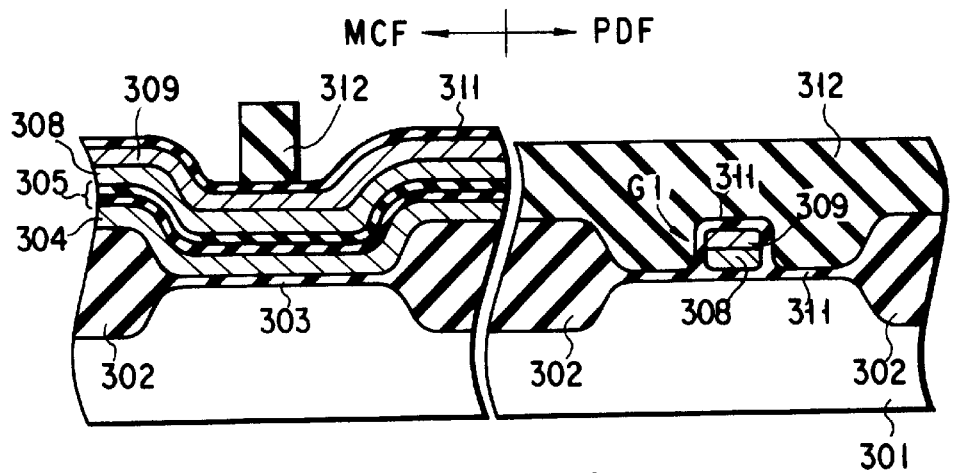
F I G. 5A
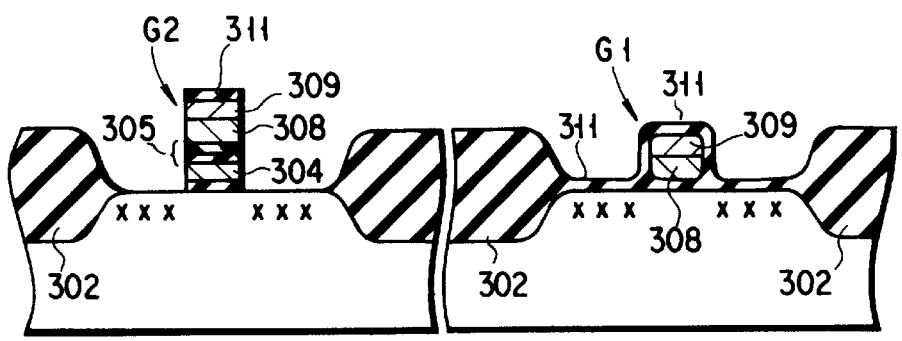
F I G. 5B
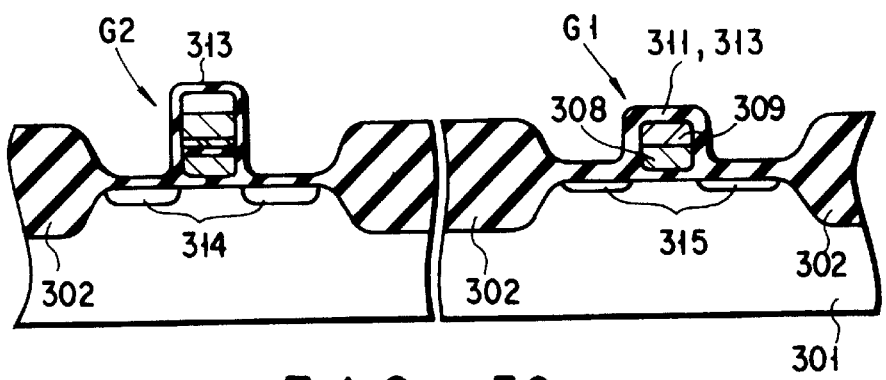
F I G. 5C

SEMICONDUCTOR APPARATUS INCLUDING SEMICONDUCTOR DEVICES OPERATED BY PLURAL POWER SUPPLIES

BACKGROUND OF THE INVENTION

1. Field of the Invention

The present invention relates to a semiconductor apparatus, such as a non-volatile memory, including semiconductor devices operated by a plurality of power supplies and a method of manufacturing the same.

2. Description of the Related Art

A demand for MOS semiconductor apparatuses has recently increased more and more. The main factors of this demand are the high density, high performance and high reliability of the semiconductor apparatus. In order to meet these features, however, the semiconductor apparatus requires many complex manufacturing steps, resulting in a decrease in yield and an increase in manufacturing cost.

There are known many types of semiconductor apparatuses using a plurality of power supplies. For example, in a non-volatile memory, a power supply of about 12 V, which is higher than the voltage used for normal data readout, is used for writing and erasing of data. Thus, a circuit associated with the data writing and erasing needs to be constituted by a high withstand voltage device capable of withstanding high voltage. On the other hand, a power supply of 5 V is used for normal data readout. Thus, a circuit associated with the data readout need not be constituted by a high withstand voltage device and may be constituted by a low withstand voltage device. In the case of the non-volatile memory, both a high withstand voltage device and a low withstand voltage device are present in one semiconductor apparatus.

In order to produce a high withstand voltage MOS transistor, it is necessary to reduce an electric field at an edge portion of the drain and decrease an abrupt change of impurity concentration at a PN junction between the substrate and a diffusion layer. For this purpose, in the prior art, the thickness of a gate oxide film is increased and the concentration in a diffusion layer is decreased. As a result, the driving performance of the device decreases, and the high density and high performance required for the semiconductor apparatus are prevented. In the prior art, in order that this influence may not act on the low withstand voltage device provided on the same substrate, a thick gate insulating film is used only in a device to which a high voltage is applied, and a thin gate insulating film is used in a device to which a relatively low voltage is applied.

FIGS. 6A to 6C and FIGS. 7A and 7B show a conventional semiconductor apparatus. As is shown in FIG. 6A, an insulating film 402 for device isolation is formed on a P-type silicon substrate 401, and a thick silicon oxide film 403 is formed on that surface of the substrate 401, excluding the region of the device isolation insulating film 402. A polysilicon film 404 is formed on the thick silicon oxide film 403 and device isolation insulating film 402. Then, a resist pattern 405 is formed on a high withstand voltage device formation region (hereinafter referred to as "HVD region"). With the resist pattern 405 used as a mask, the polysilicon film 404 and thick silicon oxide film 403 in a low withstand voltage device formation region (hereinafter referred to as "LVD region") other than the HVD region are etched.

The resist pattern 405 is removed and the entire structure is subjected to thermal oxidation, and then a polysilicon film is deposited. Thus, as shown in FIG. 6B, a thin silicon oxide film 406 is formed on the substrate 401 in the LVD region, and a polysilicon film 407 is formed on the silicon oxide film 406. At the same time, a silicon oxide film 406 is formed on the polysilicon film 404 in the HVD region and a polysilicon film 407 is formed on the silicon oxide film 406. Subsequently, a resist pattern 409 is formed in the LVD region alone. With the resist pattern 409 used as a mask, the polysilicon film 407 and silicon oxide film 406 in the HVD region are etched away.

Thereafter, as shown in FIG. 6C, resist patterns 410 are formed on gate electrode formation regions of both HVD and LVD regions. Using the resist patterns 410 as masks, the polysilicon film 404 and 407 are etched. Then, the resist pattern 410 is removed.

As a result, gate electrodes 404a and 407a are formed, as shown in FIG. 7A. With the gate electrodes 404a and 407a used as masks, phosphorus is introduced into the substrate 401 at a dosage of about $5 \times 10^{13}/cm^2$, thereby forming an N$^-$ diffusion layer of a low concentration which constitutes an LDD (Lightly Doped Drain).

Subsequently, an SiO$_2$ film is deposited on the surface of the substrate by CVD, and the SiO$_2$ film is etched back. Thus, as shown in FIG. 7B, side walls 413 are formed on the gate electrodes 404a and 407a. With the gate electrodes 404a and 407a and side walls 413 used as masks, arsenic (As) is introduced into the substrate 401 at a dosage of about $7 \times 10^{15}/cm^2$ cm, thereby forming an N$^+$ diffusion layer of a high concentration. Then, a heating step is performed and LDD N$^-$ diffusion layers 411 and N$^+$ diffusion layers 412 are formed.

In the above semiconductor apparatus thus manufactured, an electric field is reduced in the device to which a high voltage is directly applied, by virtue of the thick gate oxide film 403 and the low impurity concentration diffusion layer 411 adjoining the gate electrode edge. In addition, since an abrupt change of impurity concentration at the PN junction between the diffusion layer and the substrate is decreased by virtue of the low impurity concentration diffusion layer 411, the high withstand voltage device can be realized.

On the other hand, the device to which a low voltage is applied is provided with the thin gate insulating film 406. Thus, this device can be reduced in size with high performance in accordance with conventional scaling rules. Thus, high reliability can be ensured with the reduced size and enhanced performance.

The semiconductor apparatus manufactured by the method illustrated in FIGS. 6A to 7B, however, has the following drawbacks. Specifically, since the thick gate oxide film 403 and thin gate oxide film 406 need to be separately formed, two steps for forming the gate oxide films, two steps of depositing polysilicon films and one step of removing the polysilicon film are required. Furthermore, since the low impurity concentration diffusion layer is formed, it is necessary to form the side walls 413. Thus, many complex steps are required. The increase in number of manufacturing steps results in a low through-put, a low yield and a considerably high cost.

There is an alternative method for forming two types of gate oxide films. At first, a silicon oxide film is formed on a silicon substrate as part of a gate insulating film. After the HVD region is protected by a resist, the silicon oxide film in the LVD region is removed. Then, the resist is removed and again a silicon oxide film which becomes a gate oxide film of the LVD region is formed. In this case, the steps of depositing the polysilicon film and removing the polysilicon film, as shown in FIGS. 6B and 6C, are not needed. There is a step, however, in which a resist material containing a great amount of contaminant such as a heavy metal comes in direct contact with the silicon oxide film which becomes the gate insulating film in the HVD region. Consequently, the gate insulating film may be contaminated by the resist material and the gate insulating film may malfunction. As a result, the yield decreases considerably and the high reliability cannot be maintained. Thus, there arises the need to separately form two types of gate oxide films by the method illustrated in FIGS. 6A to 7B, and many complex steps are performed.

On the other hand, the low withstand voltage device to which a high voltage is not applied includes the low impurity concentration diffusion layer 411. Thus, the diffusion resistance increases and the decrease in driving performance is not negligible. If the side walls necessary for forming the low impurity concentration diffusion layer are selectively removed from the LVD region alone by using the resist material, the impurity concentration of the diffusion layer can be increased. In this case, however, the number of steps increases and the through-put is further degraded.

Under the circumstances, a method of forming a high withstand voltage device and a low withstand voltage device by using one type of gate insulating film has been developed, instead of the method illustrated in FIGS. 6A to 7B. FIGS. 8A to 8C show an example of this method.

In FIG. 8A, a device isolation insulating film 502 is formed on a substrate 501, and a silicon oxide film 503 which becomes a gate insulating film is formed on that surface of the substrate 501 excluding the region of the device isolation insulating film 502. After a polysilicon film is formed on the silicon oxide film 503 and device isolation insulating film 502, a resist pattern is formed on a gate electrode formation region. Then, with the resist pattern used as a mask, the polysilicon film is etched. Thus, gate electrodes 504 are formed. Subsequently, with the gate electrodes 504 used as masks, phosphorus is introduced into the substrate 501 at a dosage of about $5 \times 10^{13}/\text{cm}^2$, thereby forming an LDD N$^-$ diffusion layer.

Subsequently, as shown in FIG. 8B, a resist pattern 505 is formed in the HVD region. With the resist pattern 505 used as a mask, arsenic (As) is introduced into the substrate 501 at a dosage of about $7 \times 10^{15}/\text{cm}^2$ cm, thereby forming an N$^+$ diffusion layer.

After the resist pattern 505 is removed, as shown in FIG. 8C, oxide film 506 is formed. In this case, oxidation is performed so that bird's beaks may form adequately on the edges of the gate electrodes 504 adjacent to the substrate 501. At the same time, the impurities in the substrate 501 are activated. N$^-$ diffusion layers 507 are formed in the HVD region and N$^+$ diffusion layers 508 are formed in the LVD region. These layers function as sources and drains.

In the above semiconductor apparatus thus formed, the bird's beak provided on the edge of the gate electrode 504 of the high withstand voltage device formed in the HVD region reduces an electric field between the gate electrode 504 and substrate 501. Furthermore, the low concentration diffusion layers 507 provided in the HVD region reduces an electric field between the gate electrode 504 and diffusion layers 507 and increases the PN junction withstand voltage between the diffusion layers 507 and substrate 501.

On the other hand, the low withstand voltage device formed in the LVD region does not have a low concentration diffusion layer, and the high concentration N$^+$ diffusion layers 508 of the low withstand voltage device function as a source and a drain. Thus, an increase in wiring resistance is prevented. When this manufacturing method is adopted, the high withstand voltage device and low withstand voltage device have the same gate insulating film. Since only one type of gate insulating film is used, many steps as shown in FIGS. 6A to 7B are not required.

The semiconductor apparatus fabricated by the method shown in FIGS. 8A to 8C, however, has serious problems that the reduction in size and enhancement of performance of the low withstand voltage device cannot be achieved.

Specifically, the bird's beak provided on the gate electrode 504 of the low withstand voltage device increases the practical thickness of the gate oxidation film formed between the gate electrode 504 and the substrate 501. As a result, the drive performance of the low withstand voltage device decreases and the reduction in size of the device is prevented.

When the bird's beak is formed on the gate electrodes 504, a major thermal step needs to be performed. Thus, horizontal diffusion of impurities progresses to a high degree in the diffusion layers 508 and 507. As a result, the possibility of short-channel and punch-through in the devices increases. Obviously, this prevents reduction in size of the device. In particular, since the diffusion layers 508 in the low withstand voltage devices contain impurities at high concentration, the problem is more serious. Furthermore, since the degree of horizontal diffusion of impurities increases, overlap areas between the diffusion layers 508 and gate electrode 504 and between the diffusion layers 507 and gate electrode 504 increase. As a result, the coupling capacitances between the gate electrode 504 and diffusion layers 508 and between the gate electrode 504 and diffusion layers 507 increase and the operation speed of the device is limited.

SUMMARY OF THE INVENTION

The object of the present invention is to provide a semiconductor apparatus and a method of manufacturing the same, wherein devices driven by two different power supply voltages can be formed on a single substrate, without an increase in number of manufacturing steps or in manufacturing cost.

This object is achieved by a semiconductor apparatus comprising:

a device isolation insulating film, formed in a semiconductor substrate, for separating a surface region of the semiconductor substrate into a first region and a second region;

a first MOS transistor provided in the first region and supplied with a first power supply voltage, the first MOS transistor having a gate electrode insulated from the semiconductor substrate by a gate insulating film, and diffusion layers functioning as a source and a drain provided in the semiconductor substrate on both sides of the gate electrode, and the gate electrode having a bird's beak on an edge portion adjoining the semiconductor substrate;

a first insulating film provided on the semiconductor substrate in accordance with the source and drain in the first region;

a second MOS transistor provided in the second region and supplied with a second power supply voltage lower than the first power supply voltage, the second MOS transistor having a gate electrode insulated from the semiconductor substrate by a gate insulating film, and diffusion layers functioning as a source and a drain provided in the semiconductor substrate on both sides of the gate electrode, and the diffusion layers having a higher impurity concentration than the diffusion layers of the first MOS transistor; and a second insulating film provided on the semiconductor substrate in accordance with the source and drain in the second region, the second insulating film being thinner than the first insulating film.

The object is also achieved by a method of manufacturing a semiconductor apparatus, comprising the steps of:

forming a device isolation insulating film in a semiconductor substrate, separating a surface of the semiconductor substrate by means of the device isolation insulating film into a first region constituting a first MOS transistor and a second region constituting a second MOS transistor;

forming gate insulating films on the semiconductor substrate in the first and second regions, forming a conductive film on each of the gate insulating films, and removing the conductive film in the first region by etching, thereby forming a first gate electrode of the conductive film;

forming a thermal oxidation film, by means of thermal oxidation, on the conductive film in the second region, on the semiconductor substrate in the first region and on the first gate electrode, and forming a bird's beak on an edge of the first gate electrode;

etching away the gate insulating film, the conductive film and the thermal oxidation film on the conductive film in the second region, and forming a second gate electrode in the second region; and introducing impurities into the semiconductor substrate in the first region through the thermal oxidation film, and introducing impurities into the semiconductor substrate in the second region, thereby forming diffusion layers functioning as sources and drains of the first and second MOS transistors.

In the present invention, the gate electrode of the low withstand voltage device is not provided with a bird's beak. A bird's beak is provided on the gate electrode of the high withstand voltage device alone. The impurity concentration in the diffusion layer near the bird's beak is made lower than that in the other part of the diffusion layer. Thus, an electric field between the gate electrode and the diffusion layer can be reduced, and the withstand voltage of the device can be increased.

After the gate electrode is formed, the thermal oxidation film is provided in the high withstand voltage device. Impurities are introduced into the semiconductor substrate via the thermal oxidation film. With respect to the low withstand voltage device, impurities are introduced directly into the semiconductor substrate after the gate electrode is formed. Accordingly, by a single impurity introducing step, the high-concentration diffusion layer can be formed in the low withstand voltage device and the low-concentration diffusion layer can be formed in the high withstand voltage device. Therefore, the impurity concentrations of the low withstand voltage device and high withstand voltage device can be controlled at the same time.

As regards the low withstand voltage device, the formation of the gate bird's beak is curbed and the resistance of the diffusion layer is decreased. Thus, the low withstand voltage device can be operated at high speed with high performance.

Furthermore, the same gate oxide film is used in the high withstand voltage device and low withstand voltage device. Since only one kind of gate oxide film is used, the manufacturing steps can be simplified and the manufacturing cost can be reduced.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5A to 5C are cross-sectional views illustrating manufacturing steps following the step shown in FIG. 4C;

DETAILED DESCRIPTION OF THE PREFERRED EMBODIMENTS

Embodiments of the present invention will now be described with reference to the accompanying drawings.

FIGS. 1A to 2B show a first embodiment of the present invention. In the first embodiment, the present invention is applied to, for example, a flash type EEPROM wherein a high withstand voltage device and a low withstand voltage device are provided on a single substrate.

Figure 1A:
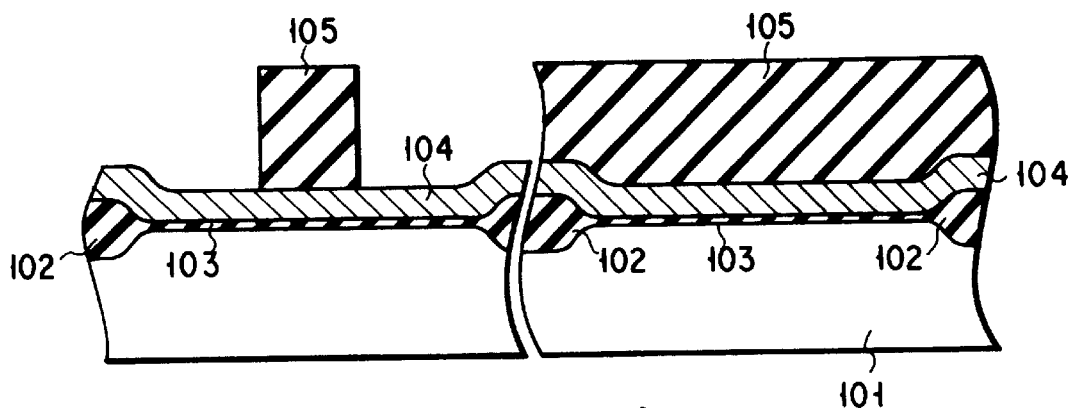
FIGS. 1A to 1C are cross-sectional views illustrating a manufacturing method according to a first embodiment of the present invention.

At first, as shown in FIG. 1A, a device isolation insulation film 102 with a thickness of 700 nm is formed in a surface portion of a P-type silicon substrate 101 by a well-known LOCOS method. Then, a silicon oxide film 103 with a thickness of 15 nm, which will become a gate oxide film, is formed in a surface portion of the substrate 101. A phosphorus-doped polysilicon film 104 with a thickness of 350 nm is formed on the silicon oxide film 103. Subsequently, a pattern corresponding to a gate electrode is formed by a resist 105 on the polysilicon film 104 in the HVD region by means of well-known lithography technique. In this case, the LVD region is covered with the resist 105.

Figure 1B:
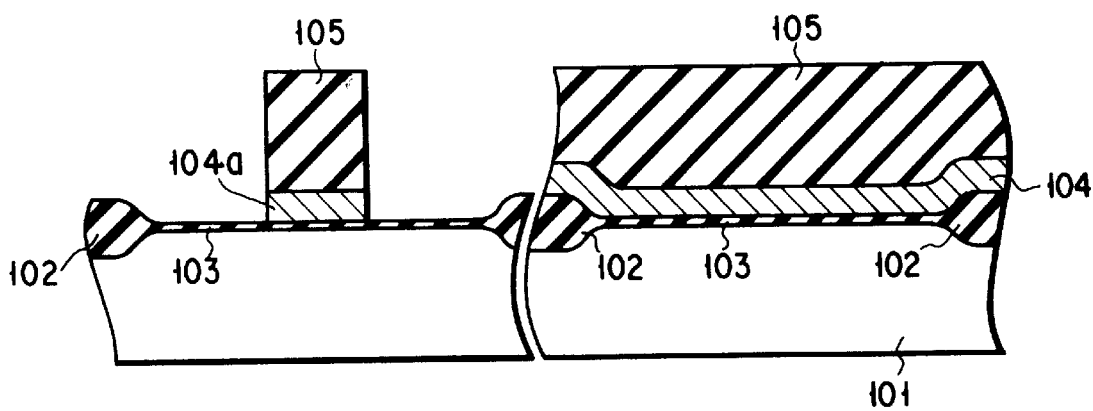

Using the resist pattern 105 as a mask, as shown in FIG. 1B, the polysilicon film 104 in the HVD region is etched, thereby forming a gate electrode 104a. At this time, the LVD region is covered with the resist 105.

Figure 1C:
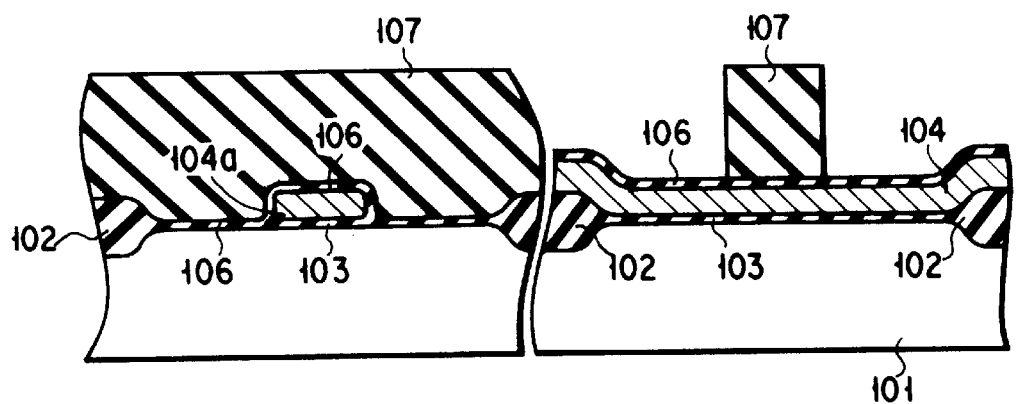

After the resist pattern 105 is removed, the resultant structure is oxidized in a "Box" atmosphere at 850° C. (an atmosphere containing steam). Thereby, as shown in FIG. 1C, a post-oxidation film 106 is formed on the surface of the gate electrode 104a in the HVD region, the surface of the substrate in the HVD region not covered by the gate electrode 104a, and on the polysilicon 104 in the LVD region. At the same time, a bird's beak is formed on the edge of the gate electrode 104a near the substrate 104. A resist pattern 107 corresponding to the gate electrode is formed on the post-oxidation film 106 in the LVD region by means of a well-known lithography technique. At this time, the HVD is covered by the resist 107. With the resist pattern 107 used as a mask, the post-oxidation film 106, polysilicon film 104 and silicon oxide film 103 in the LVD region are etched and a gate electrode 104b is formed.

Figure 2A:
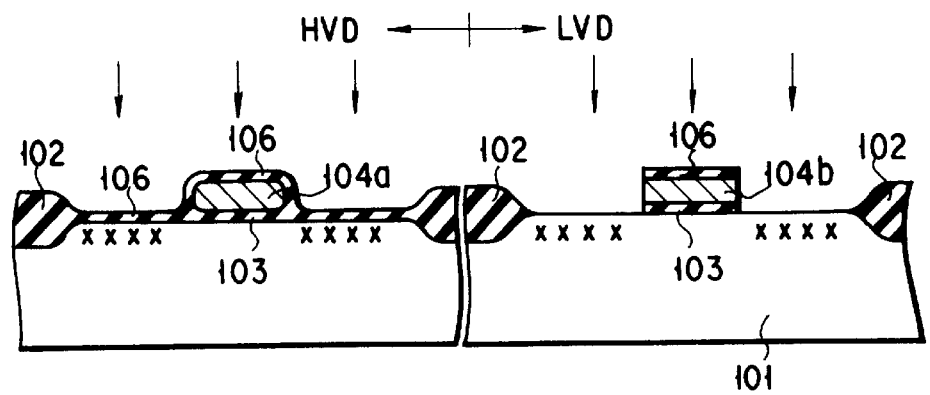
FIGS. 2A and 2B are cross-sectional views illustrating manufacturing steps following the step shown in FIG. 1C.

After the resist 107 is removed, as shown in FIG. 2A, arsenic ions for forming a source and a drain are injected in the substrate at an acceleration voltage of 60 KeV with a dosage of $1 \times 10^{16}/cm^2$ by means of a well-known self-alignment technique, with the gate electrode 104b and gate electrode 104a used as masks. The post-oxidation film 106 in the HVD region reduces effectively the dosage of arsenic ions introduced in the substrate 101. On the other hand, the substrate 101 in the source and drain formation regions in the LVD region is exposed at the time of processing the gate electrode. Thus, the dosage of arsenic ions is not reduced. Accordingly, the dosage of arsenic ions can be effectively increased in the source and drain formation regions alone in the LVD region.

Figure 2B:
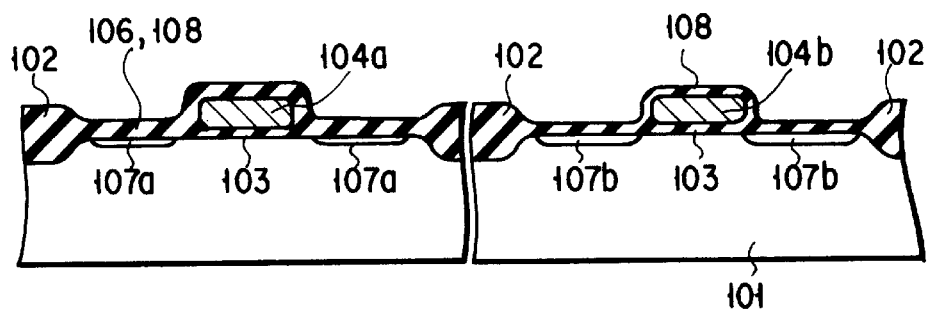

Subsequently, as shown in FIG. 2B, the resultant structure is post-oxidized in a dry atmosphere at 950° C. and an oxide film 108 is formed. At the same time, the arsenic ions introduced in the substrate 101 are activated, and diffusion layers for the source and drain are formed. Through a subsequent conventional process, a flash type EEPROM is manufactured.

Figures 3A, 3B:
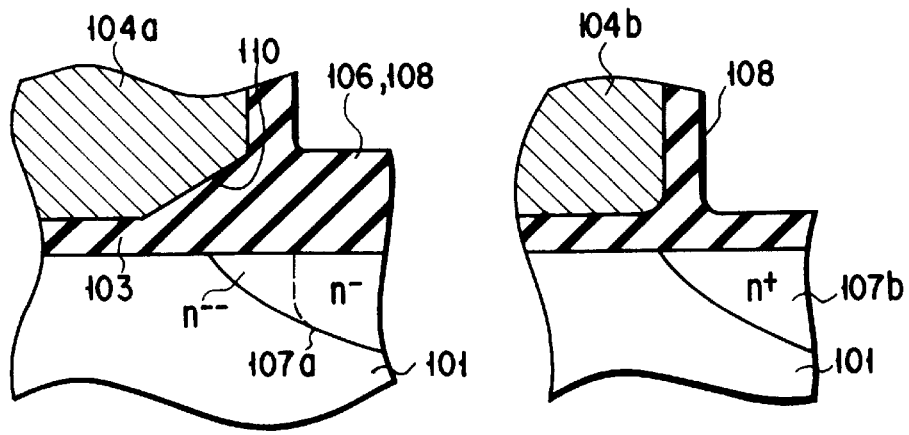
FIGS. 3A and 3B are partially enlarged cross-sectional views associated with FIG. 2B.

FIG. 3A is an enlarged view of the edge portion of the gate electrode 104a formed in the HVD region shown in FIG. 2B. A bird's beak 110 is formed on the gate electrode 104a. The bird's beak 110 reduces an electric field between the gate electrode 104a and diffusion layer 107a. The diffusion layer 107a includes an $n^{--}$ region in which the impurity concentration decreases towards the gate electrode 104a. Since the electric field between the gate electrode 104a and diffusion layer 107a can be reduced, the junction withstand voltage between the diffusion layer 107a and substrate 101 is increased. Thus, the device in the HVD region can be provided with a high withstand voltage.

FIG. 3B is an enlarged view of the edge portion of the gate electrode 104b formed in the LVD region shown in FIG. 2B. The formation of a bird's beak on the gate electrode 104b is restricted, and the practical thickness of the gate oxidation film is not increased due to the formation of the bird's beak. Since the impurity concentration in the diffusion layer 107b is increased, the diffusion resistance is sufficiently reduced. Accordingly, the low withstand voltage device formed in the LVD region can be operated at high speed.

Referring back to FIG. 1C, when the low withstand voltage side gate electrode is formed by using the resist pattern 107, there is no need to etch away the silicon oxide film 103. Specifically, a part of the silicon oxide film 103 is sufficiently thin because it needs to become the low withstand voltage side gate insulating film. Thus, when the source and drain are formed, the effect of reducing the concentration of injected ions is low. Since the silicon oxide film 103 is not etched, the etching step can be omitted. In addition, in general, the silicon oxide film on the substrate has the effect of suppressing a phenomenon in which a contaminant enters deep into the silicon substrate when the impurities are injected in the silicon substrate. Furthermore, a defect occurring when the high concentration impurities are introduced can be recovered in a subsequent annealing process. Therefore, the reliability can be ensured and the yield can be increased.

Moreover, the gate 104a formed on the HVD region is subjected to a thermal process, and the gate bird's beak is formed. Thereafter, impurity ions are implanted into the substrate 101. Therefore, horizontal diffusion of impurities by the thermal process can be prevented, and a high speed operation can be performed.

In FIG. 2A, the diffusion layer is formed by introducing arsenic into the substrate. However, the impurities are not limited to arsenic but may be phosphorus. Phosphorus ions are lighter in weight than arsenic ions. Thus, the use of arsenic ions is advantageous when it is necessary to provide the high withstand voltage device with a large bird's beak. That is, when a device with a higher withstand voltage needs to be manufactured, the post-oxidation film 106 formed in the source/drain formation region of the high withstand voltage device becomes thicker. In this case, if the impurity ion seed for forming the source and drain is heavy arsenic, it is difficult for arsenic ions to pass through the thick oxide film. Even if the acceleration energy is increased, the problem may not be solved and, in a worst case, the diffusion layer of the source/drain cannot be formed. If light impurity ions such as phosphorus ions are used, the impurity ions can pass through the thick oxide film with a low acceleration energy. Thus, the source and drain with sufficient concentration can be obtained.

In the first embodiment, the preset invention is applied to the N-channel MOS FET. However, this invention can be applied to a P-channel MOS FET. In this case, in FIG. 2A, $BF_2$ or B ions are substituted for arsenic ions as impurity ion seeds for forming the diffusion layer. Of course, the substrate is an N-well or an N-type substrate.

In the meantime, flash type EEPROMs are greatly needed in products designed for large capacity. In this case, the need for high speed operation in peripheral circuits is low, but the cells need to be reduced in size with high performance. However, in memory cell transistors, gate bird's beaks forming between control gates and floating gates degrade the write and erase characteristics and decrease the readout current. Consequently, an operation margin decreases, reliability deteriorates, and the test time from manufacture to shipment increases. Moreover, a gate bird's beak forming between the floating gate and substrate similarly degrades the write and erase characteristics and decreases the readout current.

In the case where the cell is further reduced in size, if the gate bird's beak forming between the floating gate and substrate is large, the tunnel gate oxide film about 10 nm thick cannot be obtained. Consequently, the reduction in size is limited. It is, therefore, necessary to suppress the formation of the gate bird's beak in the memory cell transistor. On the other hand, since elements of peripheral circuits perform write and erase operations, such elements requires high withstand voltage characteristics in most cases.

FIGS. 4A to 5C show a second embodiment of the present invention, in which this invention is applied to a flash type EEPROM designed to achieve a large capacity, rather than a high-speed operation. In this embodiment, peripheral circuits comprise high withstand voltage devices, and memory cell transistors comprise low withstand voltage devices.

Figure 4A:
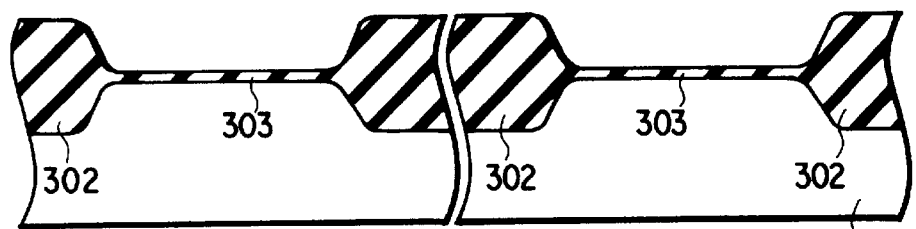
FIGS. 4A to 4C are cross-sectional views illustrating a manufacturing method according to a second embodiment of the present invention.

At first, as shown in FIG. 4A, a device isolation insulation film 302 with a thickness of 700 nm is formed in a surface portion of a P-type silicon substrate 301 by a conventional LOCOS method. The surface of the substrate 301 is thermal-oxidized, and a silicon oxide film 303 with a thickness of 10 nm, which will become a gate oxide film, is formed.

Figure 4B:
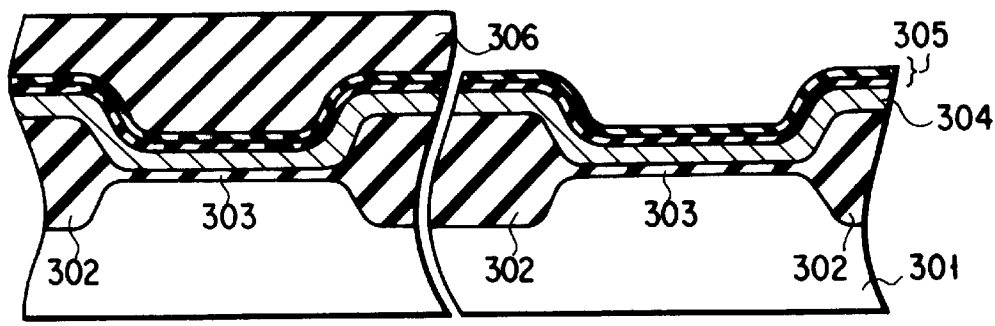

Then, as shown in FIG. 4B, a phosphorus-doped polysilicon film 304 with a thickness of 150 nm is formed on the surface of the substrate. Thereafter, an ONO film 305 functioning as a composite insulating film is formed. A memory cell formation region (hereinafter referred to as "MCF region") is covered with a resist 306. With the resist 306 used as a mask, the ONO film 305, polysilicon film 304 and silicon oxide film 303 in a peripheral device formation region (hereinafter referred to as "PDF region") are removed by conventional anisotropic etching. The resultant structure is oxidized in a dry atmosphere at 950° C. and a gate oxide film 307 with a thickness of 15 nm, which is thicker than the oxide film 303, is formed on the substrate in the PDF region. Thereafter, the resist 306 is removed.

Figure 4C:
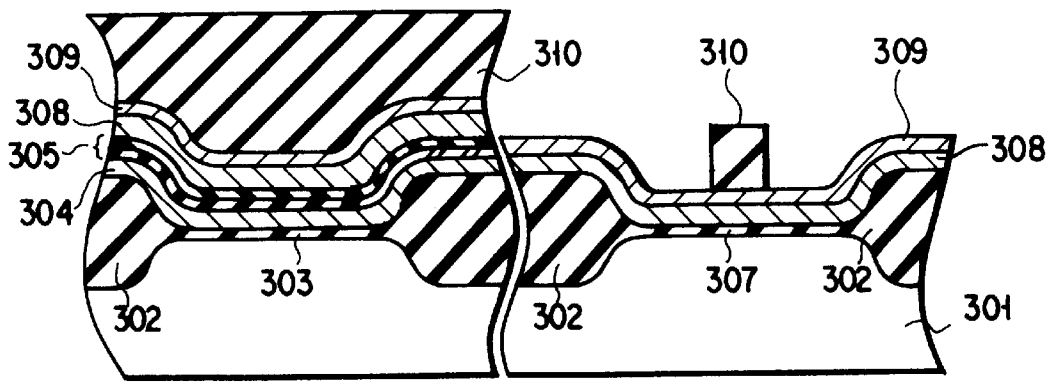
Figure 6A:
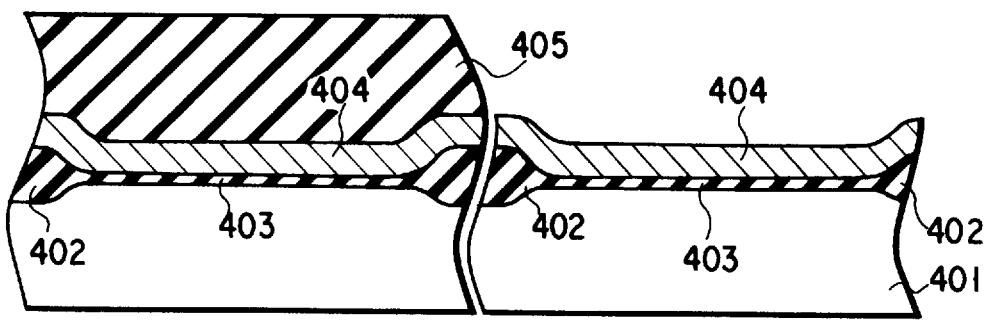
FIGS. 6A to 6C are cross-sectional views showing a method of manufacturing a conventional semiconductor apparatus.
Figure 6B:
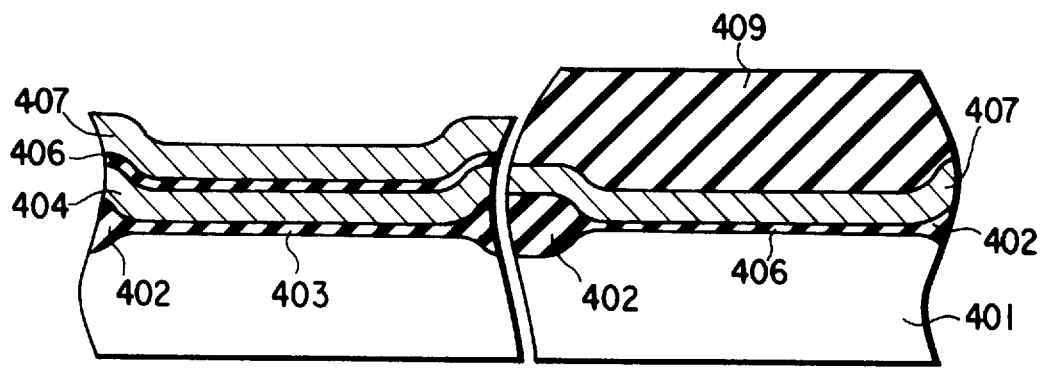
Figure 6C:
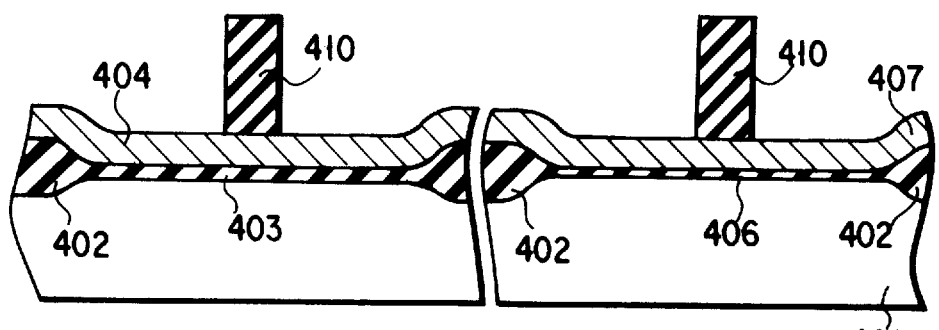
Figure 7A:
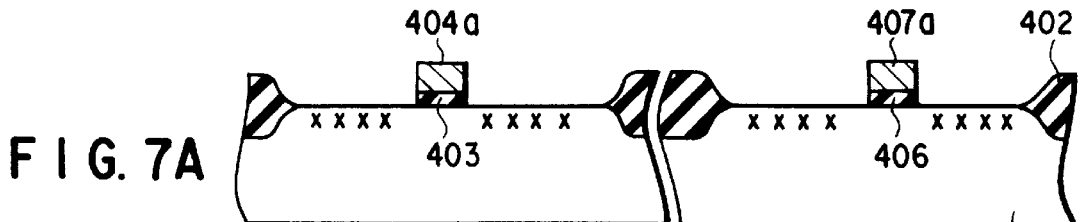
FIGS. 7A and 7B are cross-sectional views illustrating manufacturing steps following the step shown in FIG. 6C.
Figure 7B:
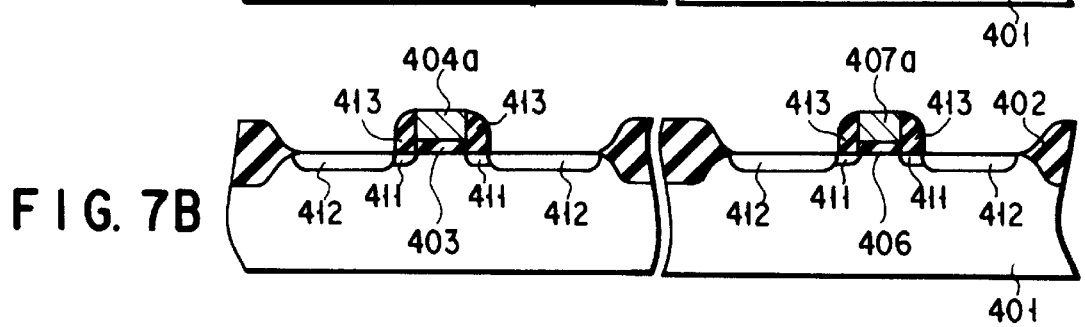
Figure 8A:
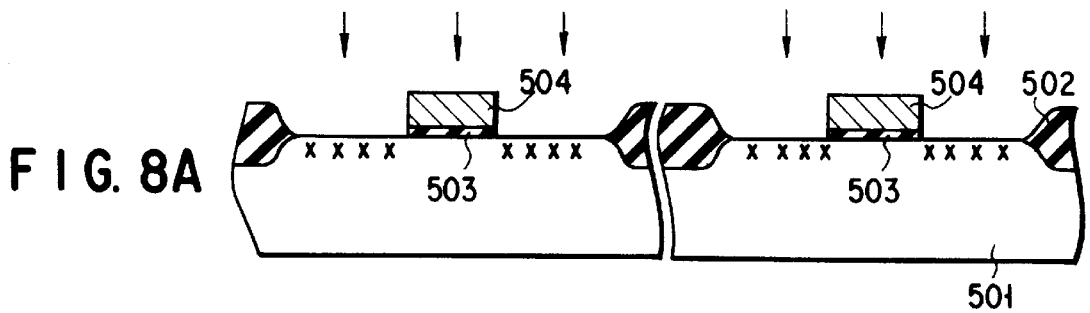
FIGS. 8A to 8C are cross-sectional views showing a method of manufacturing a conventional semiconductor apparatus other than the conventional semiconductor apparatus shown in FIGS. 6A to 7B.
Figure 8B:
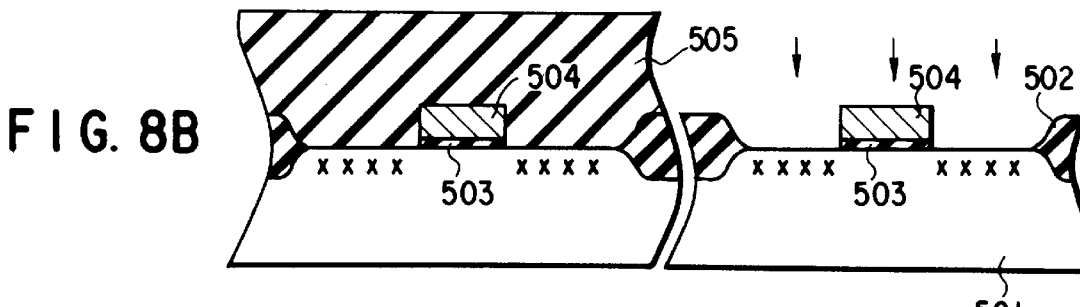
Figure 8C:
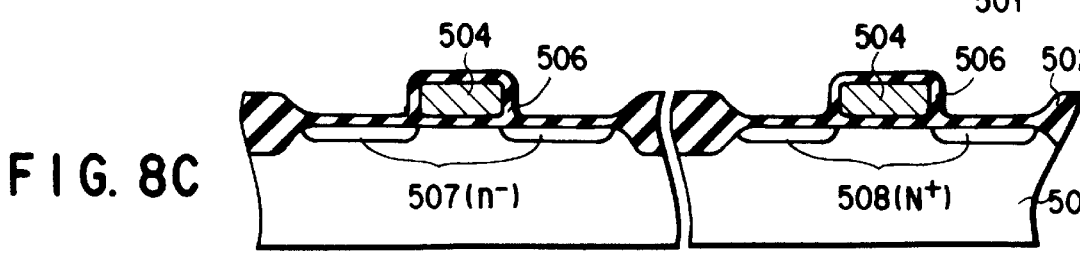

Following the above, as shown in FIG. 4C, an entirely doped polysilicon film 308 is deposited by an LPCVD method and a WSi film 309 is deposited by a sputtering method. Subsequently, the MCF region is covered with a resist 310 by means of a conventional lithography technique, and a resist 310 patterned in accordance with the gate electrode is formed in the PDF region.

Using the patterned resist 310 as a mask, the WSi film 309 and polysilicon film 308 are etched. Thus, as shown in FIG. 5A, a gate electrode G1 is formed. After the resist 310 is removed, the resultant structure is oxidized in a Box atmosphere at 850° C. Thereby, a post-oxidation film 311 is formed on the gate electrode 309, 308 and substrate 301 in the PDF region and on the WSi film 309 in the MCF region. In this case, a bird's beak is formed on the gate electrode 309, 308, and the WSi film 309 and polysilicon film 308 are changed to a polycide. Then, using a conventional lithography technique, the PDF region is covered with a resist 312, and a resist 312 patterned in accordance with the gate electrode in the MCF region is formed.

Using the resist 312 in the MCF region as a mask, the post-oxidation film 311, polycide layer (309 and 308), ONO film 305, polysilicon film 304 and silicon oxide film 303 are etched. Thus, as shown in FIG. 5B, a two-layer gate electrode G2 comprising a floating gate and a control gate is formed in the MCF region.

After the resist 312 is removed, as shown in FIG. 5B, the gates G1 and G2 are used as masks and arsenic ions are injected in source and drain formation regions in the PDF region and MCF regions by a conventional self-alignment technique at an acceleration voltage 60 keV with a dosage of $1 \times 10^{16}/cm^2$. In this case, the post-oxidation film 311 in the PDF region reduces effectively the dosage of arsenic ions. On the other hand, the substrate 301 in the source and drain formation regions in the MCF region is exposed at the time of processing the gate electrode G2. Thus, the dosage of arsenic ions is not reduced. Accordingly, the dosage of arsenic ions can be effectively increased in the source and drain formation regions alone in the MCF region.

Subsequently, as shown in FIG. 5C, the resultant structure is oxidized in a dry atmosphere at 950° C. and a post-oxide film 313 is formed on the entire structure. At the same time, the arsenic ions introduced in the substrate 301 are activated, and diffusion layers 314 and 315 for the source and drain are formed. Through a subsequent conventional process, a flash type EEPROM is manufactured.

In the flash type EEPROM thus manufactured, the impurity concentration of the diffusion layer 314 of the memory cell transistor formed in the MCF region is sufficiently increased. In addition, the formation of the gate bird's beak between the substrate 301 and floating gate 304 is curbed and the formation of the gate bird's beak on the polysilicon film 308 and WSi film 309 constituting the control gate is curbed. Accordingly, a high electric field necessary for the write and erase operations can easily be obtained and even high-density memory cells can perform high-speed write and erase operations.

On the other hand, in the transistor formed in the PDF region, the impurity concentration in the source/drain diffusion layer 315 is low. In addition, the bird's beak forms on the polysilicon film 308 constituting the gate electrode G1. Thus, in this transistor, an electric field is reduced and a withstand voltage is raised.

The structure of the gate electrode shown in FIG. 4A to FIG. 5C is not limited to the polycide structure. The gate electrode may be formed of impurity-doped polysilicon. In this case, the etching is facilitated at the time of forming the gate electrode, and a decrease in yield due to a residue of etching can be prevented. Therefore, this technique is advantageous when the manufacturing cost needs to be decreased.

What is claimed is:

1. A semiconductor apparatus comprising:
   a device isolation insulating film, formed in a semiconductor substrate, for separating a surface region of the semiconductor substrate into a first region and a second region;
   a first MOS transistor provided in said first region and supplied with a first power supply voltage, said first MOS transistor having a gate electrode insulated from said semiconductor substrate by a gate insulating film, and diffusion layers functioning as a source and a drain provided in said semiconductor substrate on both sides of the gate electrode, and said gate electrode having a bird's beak on an edge portion adjoining the semiconductor substrate; and
   a second MOS transistor provided in said second region and supplied with a second power supply voltage lower than said first power supply voltage, said second MOS transistor having a gate electrode insulated from said semiconductor substrate by a gate insulating film, and diffusion layers functioning as a source and a drain provided in said semiconductor substrate on both sides of the gate electrode, said diffusion layers having a higher impurity concentration than the diffusion layers of said first MOS transistor, and said diffusion layers of said second MOS transistor being deeper than said diffusion layers of said first MOS transistor.

2. A device according to claim 1, wherein said diffusion layers of the first region include a portion with a lower impurity concentration than the other portion at a location near said bird's beak.

3. A device according to claim 1, wherein said first MOS transistor is a high withstand voltage device and said second MOS transistor is a low withstand voltage device.

4. A device according to claim 3, wherein said first MOS transistor constitutes a part of a peripheral circuit of an EEPROM, and said second MOS transistor constitutes a part of a memory cell of the EEPROM.

5. A device according to claim 3, wherein the gate electrode of the first MOS transistor is formed of an impurity-containing polysilicon.

6. A device according to claim 3, wherein the gate electrode of the first MOS transistor is formed of a polycide in which a polysilicon and a high-melting-point metal are laminated.

7. A device according to claim 6, wherein said polycide consists of a polysilicon and a high-melting-point metal, and said polysilicon and high-melting-point metal have a bird's beak.

8. The semiconductor device according to claim 1, further comprising:
a first insulating film provided on said semiconductor substrate in accordance with said source and drain in said first region; and
a second insulating film provided on said semiconductor substrate in accordance with said source and drain in said second region, said second insulating film being thinner than said first insulating film.

9. A method of manufacturing the semiconductor apparatus of claim 1, comprising the steps of:
forming a device isolation insulating film in a semiconductor substrate, separating a surface of the semiconductor substrate by means of said device isolation insulating film into a first region constituting a first MOS transistor and a second region constituting a second MOS transistor;
forming gate insulating films on the semiconductor substrate in said first and second regions, forming a conductive film on each of the gate insulating films, and removing the conductive film in the first region by etching, thereby forming a first gate electrode of said conductive film;
forming a thermal oxidation film, by means of thermal oxidation, on the conductive film in the second region, on the semiconductor substrate in the first region and on the first gate electrode, and forming a bird's beak on an edge of the first gate electrode;
etching away the gate insulating film, the conductive film and the thermal oxidation film on the conductive film in the second region, and forming a second gate electrode in the second region; and
introducing impurities into the semiconductor substrate in the first region through said thermal oxidation film, and introducing impurities into the semiconductor substrate in the second region, thereby forming diffusion layers functioning as sources and drains of the first and second MOS transistors.

10. A method according to claim 9, wherein said first MOS transistor is supplied with a first power supply voltage, and the second MOS transistor is supplied with a second power supply voltage lower than the first power supply voltage.

11. A method according to claim 9, wherein said diffusion layers of the first region include a portion with a lower impurity concentration than the other portion at a location near said bird's beak.

12. A method of manufacturing the semiconductor apparatus of claim 1, comprising the steps of:
forming a device isolation insulating film in a semiconductor substrate, separating a surface of the semiconductor substrate by means of said device isolation insulating film into a first region constituting a first MOS transistor and a second region constituting a second MOS transistor;
forming first oxide films on the semiconductor substrate in said first and second regions, forming a first conductive film and a composite insulating film on each of the first oxide films, and etching away the first oxide film, the first conductive film and the composite insulating film in the second region;
forming a second oxide film thicker than the first oxide film on the substrate in the second region;
forming a second conductive film on the composite insulating film in the first region and on the second oxide film in the second region;
etching away the second oxide film and the second conductive film in the second region, thereby forming a gate electrode of the second transistor;
forming a thermal oxidation film, by means thermal oxidation on the second conductive film in the first region, on the gate electrode of the second transistor and on a surface of the second region, and, at the same time, forming a bird's beak on an edge of the first gate electrode;
etching away the thermal oxidation film, the first and second conductive films, the composite insulating film and the first oxide film in the first region, and forming a gate electrode of the first MOS transistor;
introducing impurities into the semiconductor substrate in the first region, with the gate electrode of the first MOS transistor used as a mask, and introducing impurities into the second region through the thermal oxidation film, with the gate electrode of the second MOS transistor used as a mask, thereby forming diffusion layers functioning as sources and drains of the first and second MOS transistors; and
forming a third oxide film on the semiconductor substrate in the first region, on the gate electrode of the first MOS transistor, and on the thermal oxidation film in the second region.

13. A method according to claim 12, wherein the gate electrode of the second MOS transistor is formed of an impurity-containing polysilicon.

14. A method according to claim 12, wherein the gate electrode of the second MOS transistor is formed of a polycide in which a polysilicon and a high-melting-point metal are laminated.

15. A method according to claim 14, wherein said polycide consists of a polysilicon and a high-melting-point metal, and said polysilicon and high-melting-point metal have a bird's beak.

16. A method according to claim 12, wherein said first MOS transistor constitutes a memory cell of an EEPROM and said second MOS transistor constitutes a part of a peripheral circuit of the EEPROM.

17. A method according to claim 12, wherein said first MOS transistor is a low withstand voltage device and said second MOS transistor is a high withstand voltage device.

* * * * *